United States Patent
Yamaki (10) Patent No.: US 8,874,986 B2
(45) Date of Patent: Oct. 28, 2014

(54) STORAGE DEVICE INCLUDING ERROR CORRECTION FUNCTION AND ERROR CORRECTION METHOD

(75) Inventor: Ryo Yamaki, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 238 days.

(21) Appl. No.: 13/426,997

(22) Filed: Mar. 22, 2012

(65) Prior Publication Data

US 2013/0132792 A1 May 23, 2013

(30) Foreign Application Priority Data

Nov. 21, 2011 (JP) ................................ 2011-253807

(51) Int. Cl.
 *H03M 13/00* (2006.01)
 *G06F 11/10* (2006.01)
 *G11C 29/04* (2006.01)

(52) U.S. Cl.
 CPC .... *G06F 11/1048* (2013.01); *G11C 2029/0411* (2013.01)
 USPC ............................ 714/755; 714/752; 714/766

(58) Field of Classification Search
 CPC . H03M 13/2957; H03M 13/29; H03M 13/27; H03M 13/2906; G11B 20/1833; G11F 11/10
 USPC .......................... 714/752, 755, 766
 See application file for complete search history.

(56) References Cited

U.S. PATENT DOCUMENTS

| | | | | |
|---|---|---|---|---|
| 6,615,387 | B1* | 9/2003 | Williamson et al. | 714/785 |
| 8,151,162 | B2* | 4/2012 | Kanaoka et al. | 714/755 |
| 8,301,979 | B2* | 10/2012 | Sharon et al. | 714/763 |
| 8,510,624 | B2* | 8/2013 | Kim et al. | 714/755 |
| 2005/0193312 | A1* | 9/2005 | Smith et al. | 714/755 |
| 2009/0044077 | A1* | 2/2009 | Choi et al. | 714/764 |
| 2009/0150749 | A1* | 6/2009 | Kim et al. | 714/758 |
| 2011/0010604 | A1* | 1/2011 | Hwang et al. | 714/755 |
| 2011/0258514 | A1* | 10/2011 | Lasser | 714/763 |
| 2012/0204077 | A1* | 8/2012 | D'Abreu et al. | 714/755 |

FOREIGN PATENT DOCUMENTS

| | | |
|---|---|---|
| JP | 2000-339228 | 12/2000 |
| JP | 2009-59422 | 3/2009 |
| JP | 2010-67060 | 3/2010 |

* cited by examiner

*Primary Examiner* — Albert Decady
*Assistant Examiner* — Osman Alshack
(74) *Attorney, Agent, or Firm* — Oblon, Spivak, McClelland, Maier & Neustadt, L.L.P.

(57) ABSTRACT

According to one embodiment, a storage device includes a first encoder, a storage medium, a second encoder, and a wireless communication unit. The first encoder generates a first codeword including a first information part corresponding to at least a part of write data, and a first redundant part used to correct the first information part. The storage medium stores the first codeword. The second encoder generates a second redundant part used to correct a second information part corresponding to the first codeword or the first information part. The wireless communication unit wirelessly transmits the second redundant part to an external storage device.

19 Claims, 8 Drawing Sheets

STORAGE DEVICE INCLUDING ERROR CORRECTION FUNCTION AND ERROR CORRECTION METHOD

CROSS-REFERENCE TO RELATED APPLICATIONS

This application is based upon and claims the benefit of priority from prior Japanese Patent Application No. 2011-253807, filed Nov. 21, 2011, the entire contents of which are incorporated herein by reference.

FIELD

Embodiments described herein relate generally to a storage device having an error correction function of data, and an error correction method.

BACKGROUND

For example, it becomes harder for a semiconductor nonvolatile storage medium such as a NAND flash memory to keep a lower cell error ratio as a fine-process is executed for that medium. In the storage device using the NAND flash memory, redundant data for write data from a host is generated using error correction codes, and the data and redundant data are written in the NAND flash memory.

In general, in the error correction codes, as a larger redundant part is set (to decrease an encoding ratio) with respect to an information part, a correction capability is enhanced. However, when a redundant write amount becomes large, a logical capacity where the host can store data becomes smaller with respect to a physical capacity of a storage medium. When the information part and redundant part are allocated in areas in which they cannot be simultaneously accessed, on the medium, a write or read performance lowers. Hence, by allocating the information part and redundant part in an area in which they can be simultaneously accessed, the write and read performances can be enhanced.

As an error correction technique, hierarchization or long coding of error correction codes, a combination of encoder and decoder which enhance a correction capability decided based on probability information, and the like have been proposed.

The hierarchization of codes is a method of generating a plurality of codewords for one information part, providing different error correction capabilities to the respective codewords, and attempting to decode in turn from a codeword which can be decoded quickly. With this hierarchization of codes, a high error correction capability including decoding of a codeword in the last layer can be obtained while maintaining an average read performance. However, redundant parts of all layers are large, and when all these redundant parts are stored in a storage medium, the logical capacity of the storage medium is reduced.

The long coding of codes uses, in general, a property in which a frame including long codewords can set a lower frame error ratio than a frame including short codewords at the same encoding ratio. This is because a probability of concentrating errors in one codeword in a frame, which errors cannot be corrected by that codeword, is lower for a long codeword than a short codeword. However, when a long codeword is set, an error correction capability decided by an encoding ratio is limited. Also, as a codeword becomes longer, a longer decoding time is required, thus impairing the read performance.

A method of enhancing a correction capability of a codeword itself using probability information for respective bits of the codeword is available. However, a read access of the probability information requires a longer time than a normal bit read access, and a decoder requires a larger circuit scale and consumption power.

DETAILED DESCRIPTION

In general, according to one embodiment, a storage device includes a first encoder, a storage medium, a second encoder, and a wireless communication unit. The first encoder generates a first codeword including a first information part corresponding to at least a part of write data, and a first redundant part used to correct the first information part. The storage medium stores the first codeword. The second encoder generates a second redundant part used to correct a second information part corresponding to the first codeword or the first information part. The wireless communication unit wirelessly transmits the second redundant part to an external storage device.

Respective embodiments will be described hereinafter with reference to the drawings. Note that in the following description, the same reference numerals denote nearly or substantially the same functions and components, and a description will be given as needed.

First Embodiment

This embodiment will explain a storage device which includes a wireless communication device and performs data error correction.

For example, a storage device which includes a wireless communication device such as an SD card with a wireless LAN function can transmit data written in a storage medium to a server on a network. This corresponds to generation of a backup of the data in the server on the network. Even if an error has occurred at a read access timing of the SD card, since the data is saved in the server on the network, a data failure probability in a whole system including the SD card and server can be reduced. However, data which flows through a wireless communication channel and data that uploaded to the server on the network may be stolen by a third party by eavesdropping or an illicit access. When all data are backed up on the server via the wireless communication device, write accesses take time, resulting in an increase in consumption power. When a read error has occurred in the storage medium, whole data is downloaded from the server to the SD card. The server requires the same capacity as the storage device of the user.

Hence, this embodiment implements a storage device having the following arrangement.

Figure 1:
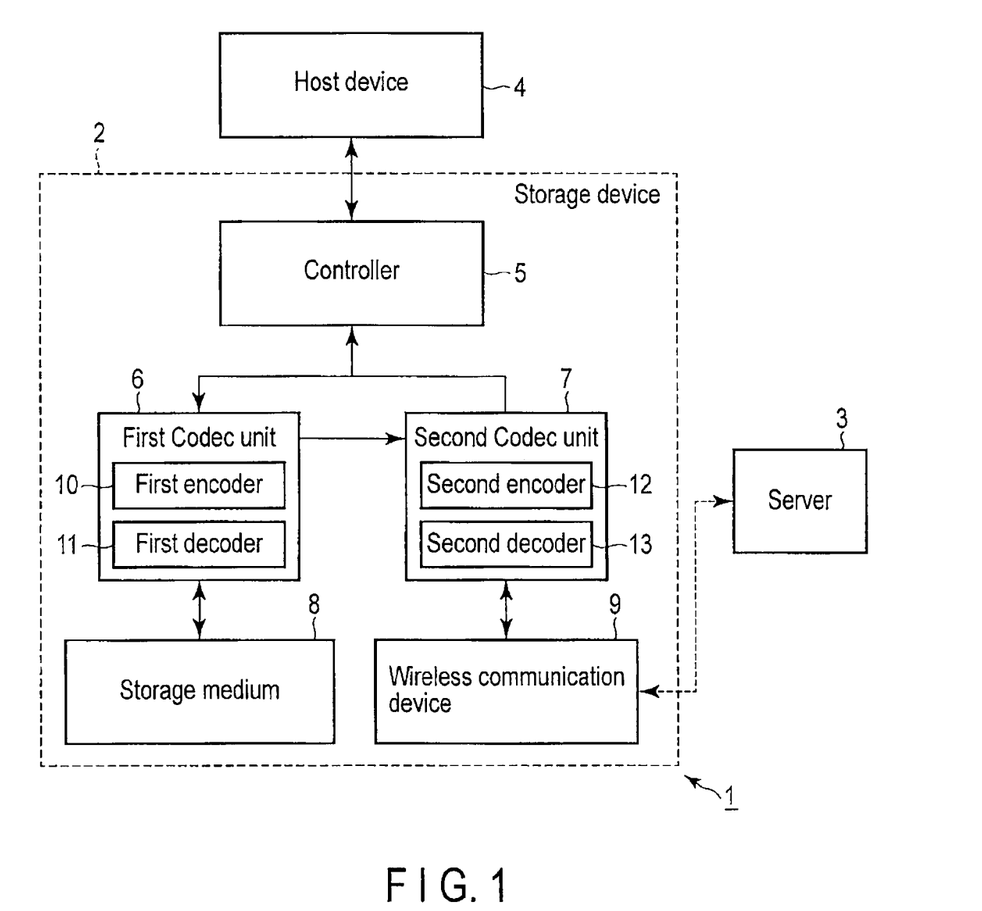
FIG. 1 is a block diagram showing an example of an arrangement of a storage device according to a first embodiment.

FIG. 1 is a block diagram showing an example of an arrangement of the storage device according to this embodiment.

A storage system 1 includes a host device 4, a storage device 2, and server (data storage server) 3. The storage device 2 is connected to a host device 4.

Furthermore, the storage device 2 includes a controller 5, first Codec unit 6, second Codec unit 7, storage medium 8, and wireless communication device 9. The first Codec unit 6 includes a first encoder 10 and first decoder 11. The second Codec unit 7 includes a second encoder 12 and second encoder 13.

In this embodiment, the storage device 2 includes the wireless communication device 9, and the storage device 2 and server 3 can wirelessly communicate with each other via a wireless communication channel.

In this embodiment, a codeword (code data) includes an information part and redundant part. A codeword can be corrected using a redundant part up to a given level. The redundant part is, for example, an error correction code such as parity bits.

In this embodiment, assume that an encoding ratio of a first codeword generated by the first encoder 10 of the first Codec unit 6 is equal to or lower than that of a second codeword generated by the second encoder 12 of the second Codec unit 7.

The controller 5 controls operations of various components in the storage device 2. For example, at a write access timing from the host device 4, the controller 5 executes control for generating first and second codewords based on write data, control for writing the first codeword in the storage medium 8, and control for transmitting a second redundant part of the second codeword and its identification information to the server 3 using the wireless communication device 9 without transmitting a second information part of the second codeword. Also, for example, when a decoding error has occurred in the first codeword, the controller 5 executes control for reading out the second redundant part of the second codeword from the server 3 using the wireless communication device 9, and decoding the second codeword.

Assume that the storage medium 8 is a nonvolatile storage medium. As the storage medium 8, for example, a semiconductor storage device such as a NAND flash memory is used. Note that the storage device 2 may include, for example, a volatile storage medium such as a DRAM (Dynamic Random Access Memory) or SRAM (Static Random Access Memory), and may use this volatile storage medium as a read/write buffer. Also, a volatile storage medium included in the storage device 2 may store a second redundant part, non-transmitted data list, and non-generated data list (to be described later).

Figure 2:
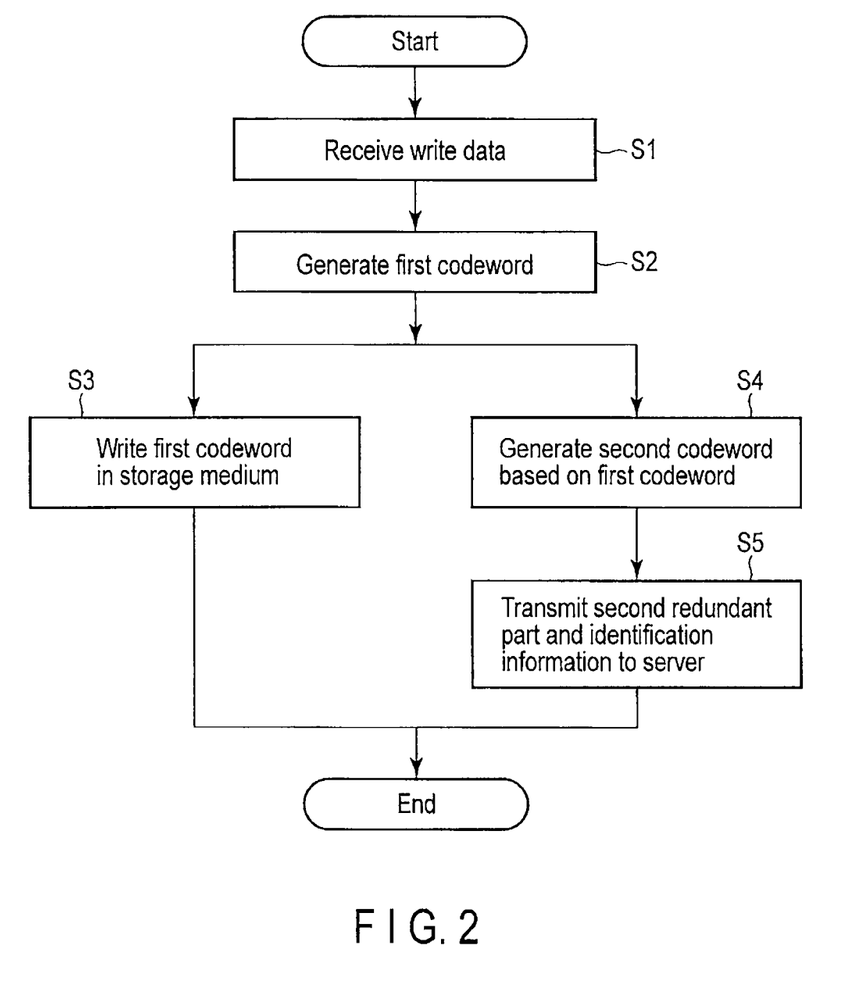
FIG. 2 is a flowchart showing an example of write processing in the storage device according to the first embodiment.

FIG. 2 is a flowchart showing an example of write processing in the storage device 2 according to this embodiment.

In step S1, the host device 4 provides write data to the controller 5. The controller 5 receives the write data from the host device 4, and provides it to the first Codec unit 6. The first encoder 10 of the first Codec unit 6 receives the write data from the controller 5.

In step S2, the first encoder 10 applies first encoding processing to at least a part (a size unit of a first information part of a first codeword) of the write data to generate a first codeword. The first codeword includes a first information part and a first redundant part used to correct this first information part. The first information part of the first codeword corresponds to at least a part of the write data.

In step S3, the first encoder 10 stores both the first information part and first redundant part of the first codeword in the storage medium 8.

In step S4, the second encoder 12 of the second Codec unit 7 receives the first codeword from the first encoder 10, and the second Codec unit 7 receives its identification information from the controller 5. As the identification information, an address used in read/write accesses to the storage medium 8 can be used. The second encoder 7 generates a second codeword by executing second encoding processing while considering the first codeword as a second information part of the second codeword. The second codeword includes the second information part corresponding to the first codeword, and a second redundant part used to correct this second information part. Then, the second Codec unit 7 provides the second redundant part of the second codeword and its identification information to the wireless communication device 9.

In step S5, the wireless communication device 9 transmits the second redundant part of the second codeword and its identification information to the server 3 but it does not transmit the second information part. The server 3 receives the second redundant part and its identification information from the wireless communication device 9, and stores the second redundant part and its identification information in association with each other.

In the above write processing, data, which is transmitted from the storage device 2 to the server 3 via a wireless communication channel, includes the second redundant part of the second codeword generated based on the write data transmitted from the host device 4 to the storage device 2, and its identification information, but the second information part of the second codeword or the like is not transmitted from the storage device 2 to the server 3. Therefore, the storage system 1 according to this embodiment can reduce communication cost (transfer time and consumption power at the time of transfer) required for the wireless communication device 9 and the loads (data transfer amount and storage capacity) on the server 3, thus assuring high security as compared with a system in which write data is sent from the storage device to the server 3 to back up the data.

Figure 3:
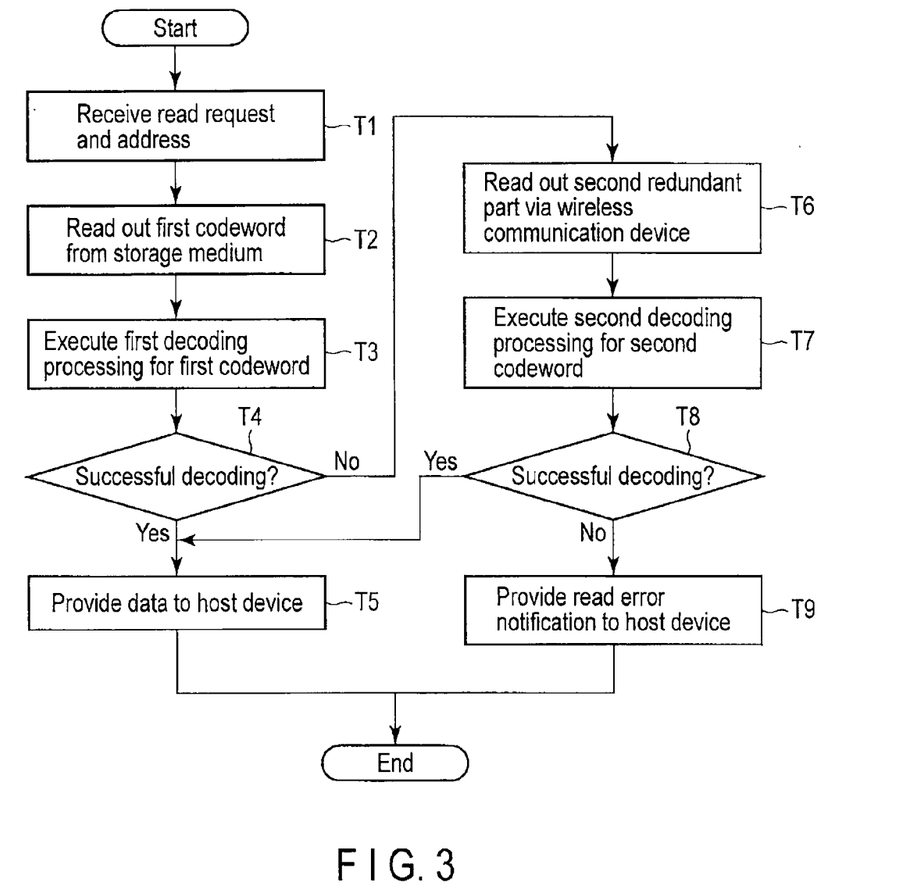
FIG. 3 is a flowchart showing an example of read processing from the storage device according to this embodiment.

FIG. 3 is a flowchart showing an example of read processing from the storage device 2 according to this embodiment.

In step T1, the host device 4 provides a read request and an address of data to be read out to the controller 5.

In step T2, the controller 5 reads out a first codeword specified by the address from the storage medium 8, and the first decoder 11 of the first Codec unit 6 receives the readout first codeword.

In step T3, the first decoder 11 executes first decoding processing for the first codeword.

The first decoder 11 determines in step T4 whether or not the first decoding processing has succeeded. If the first decoding processing has succeeded, the process advances to step T5. If the first decoding processing has failed, the process advances to step T6.

In step T5, the controller 5 provides the data to the host device 4.

In step T6, the first decoder 11 provides the first codeword to the second Codec unit 7, and the controller 5 provides its identification information to the second Codec unit 7. The second Codec unit 7 reads out a second redundant part from the server 3 based on the identification information using the wireless communication device 9.

In step T7, the second decoder 13 of the second Codec unit 7 executes second decoding processing for a second codeword which includes a second information part corresponding to the first codeword and the second redundant part.

The second decoder 13 determines in step T8 whether or not the second decoding processing has succeeded. If the second decoding processing has succeeded, the process advances to step T5. If the second decoding processing has failed, the process advances to step T9.

In step T9, the second decoder 13 provides a read error notification to the controller 5, which provides the read error notification to the host device 4.

In this read processing, when the controller 5 receives a read request and address from the host device 4, it reads out the corresponding data (first codeword) from the storage medium 8. At this time, the first decoder 11 executes the first decoding processing for the first codeword. When the first decoding processing has succeeded, data is transferred to the host device 4. When the first decoding processing for the first codeword has failed, the second decoder 13 reads out a corresponding second redundant part from the server 3 on the communication network using the wireless communication device 9. The second decoder 13 executes the second decoding processing for a second codeword based on the readout second redundant part and the first codeword (corresponding to a second information part of the second codeword). When the second decoding processing for the second codeword has succeeded, data is transferred to the host device 4. When the second decoding processing for the second codeword has failed, a read error notification is transmitted to the host device 4.

In this embodiment, an encoding ratio of the first codeword is designed to be high so as to allow a high-speed operation of the storage device 2 in a situation in which the number of bit errors of the storage medium 8 is small. By setting the high encoding ratio, an occupation ratio of the first information part of the first codeword in an area on the storage medium 8 accessed by the controller 5 becomes large.

An encoding ratio of the second codeword is designed to be equal to or lower than the first codeword, so that data can be saved even in a situation in which a large number of bit errors are generated due to aging deterioration of the storage medium 8. Furthermore, the encoding ratio of the second codeword is set to be higher than 0.5. The reason for this will be described below.

As the encoding ratio of the second codeword is lower, a larger number of bit errors can be saved by the storage system 1 as a whole. However, when the encoding ratio is set to be equal to or lower than 0.5, the amount of data stored in the server 3 becomes larger than that of data stored in the storage medium 8 of the storage device 2. Hence, cost (transfer time and consumption power at the time of transfer) required for the wireless communication device 9 and the loads (data transfer amount and storage capacity) on the server become equal to or larger than those when all write data to be written from the host device 4 in the storage device 2 are transmitted to the server 3, and the cost reduction effect can no longer be obtained.

In case of a codeword, the encoding ratio of which is higher than 0.5, and which has a sufficiently large code length, it is nearly impossible to restore the entire codeword from a redundant part. For this reason, even when data flowing through a wireless communication channel is eavesdropped, or when the server 3 on the network is illicitly accessed, a third party can only acquire a second redundant part, thus securely protecting data.

Figure 4:
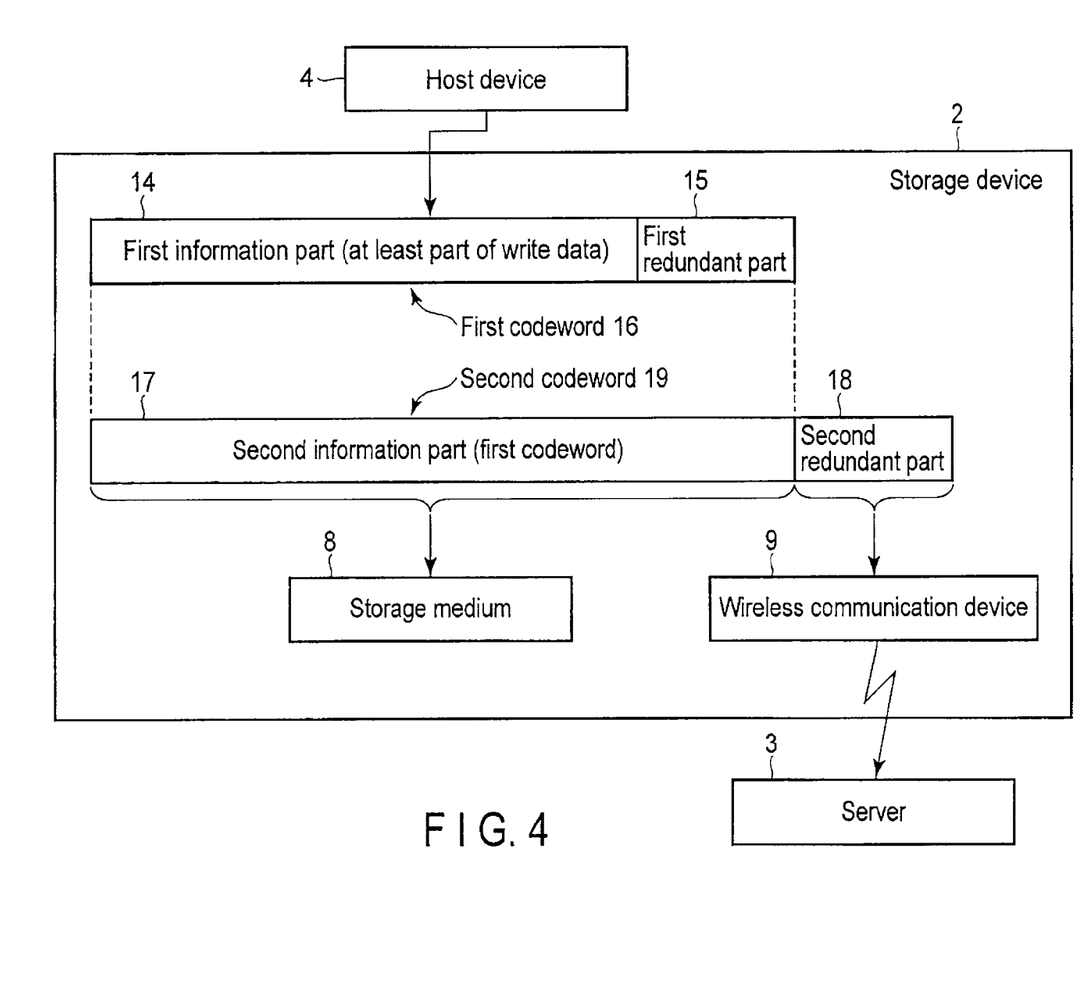
FIG. 4 is a block diagram showing an example of configurations of first and second codewords in the write processing.

FIG. 4 is a block diagram showing an example of configurations of the first and second codewords in the write processing.

The storage device 2 sets at least a part of write data received from the host device 4 as a first information part 14, and calculates a first redundant part 15 used to correct the first information part 14, thus generating a first codeword 16 including the first information part 14 and first redundant part 15.

Furthermore, the storage device 2 sets the first codeword 16 as a second information part 17, and calculates a second redundant part 18 used to correct the second information part 17, thus generating a second codeword 19 including the second information part 17 and second redundant part 18.

As described above, the encoding ratio of the first codeword 16 is preferably higher than that of the second codeword 19. In this case, a latency of decoding for the first codeword 16 can be smaller than that of decoding for the second codeword 19, and a throughput for the first codeword 16 can be smaller than that for the second codeword 19.

The wireless communication device 9 of the storage device 2 transmits the second redundant part 18 of the second codeword 19 and its identification information to the server 3.

Figure 5:
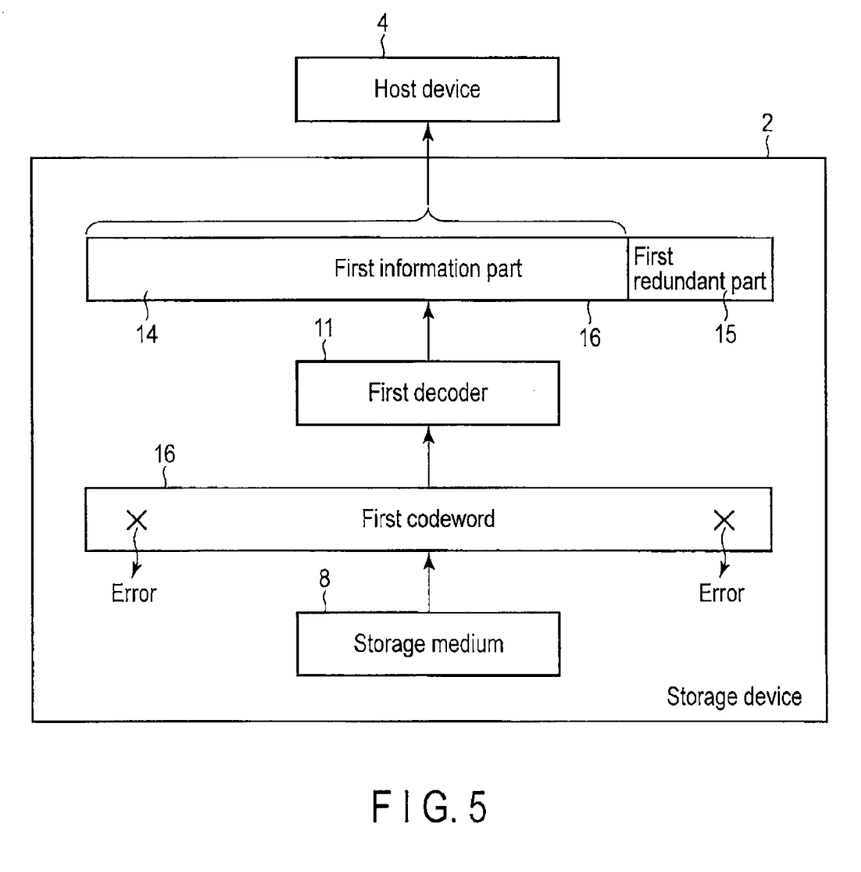
FIG. 5 is a block diagram showing an example of a sequence of the correctable first codeword from the storage medium to a host device.

FIG. 5 is a block diagram showing an example of a sequence of the correctable first codeword 16 from the storage medium 8 to the host device 4.

The storage device 2 reads out the first codeword 16 from the storage medium 8, and corrects errors included in the first codeword 16 using the first decoder 11. Then, the storage device 2 provides the first information part 14 of the error-corrected first codeword 16 to the host device 4.

Figure 6:
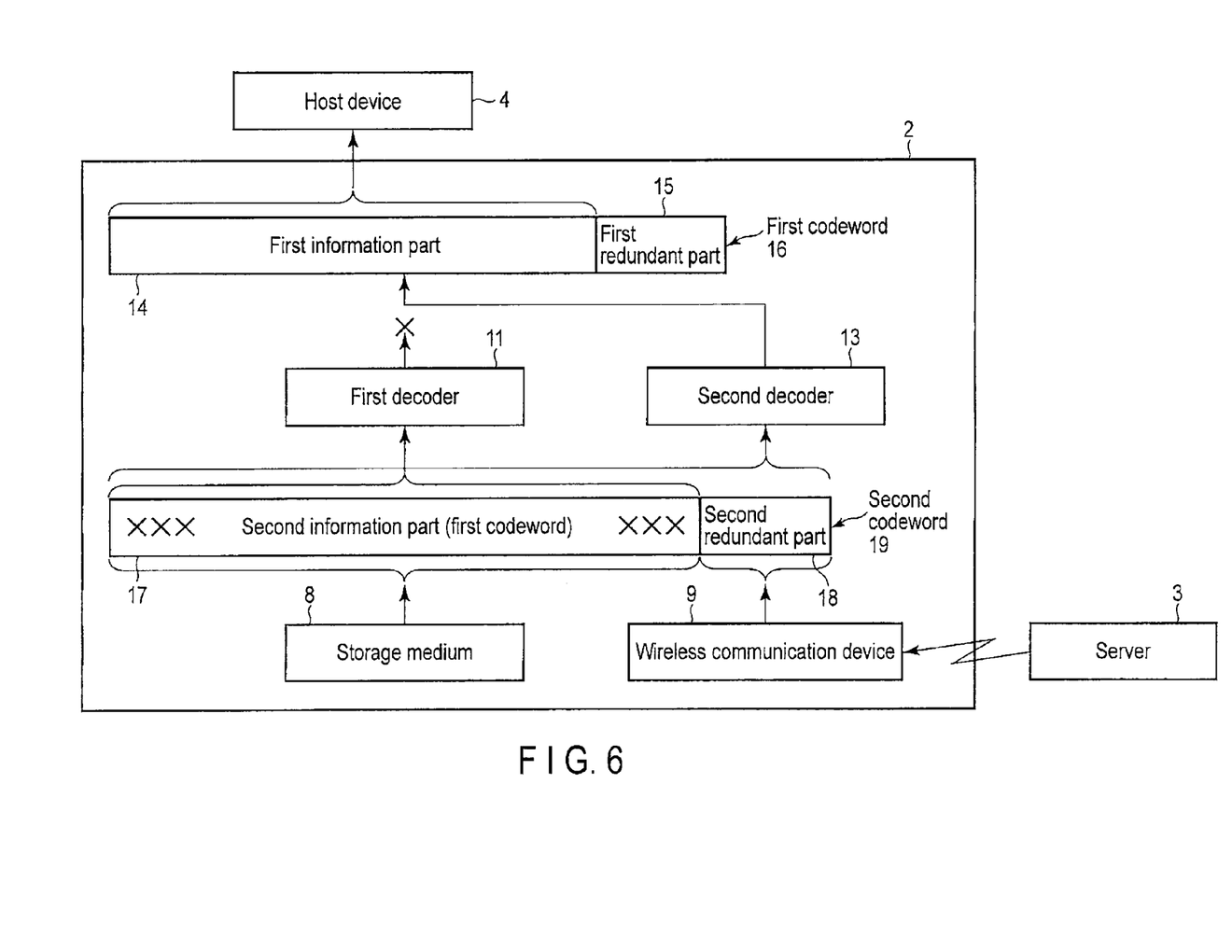
FIG. 6 is a block diagram showing an example of configurations of the first codeword and second codeword in the read processing.

FIG. 6 is a block diagram showing an example of configurations of the first codeword 16 and second codeword 19 in the read processing.

The storage device 2 reads out the first codeword 16 from the storage medium 8, and corrects errors included in the first codeword 16 using the first decoder 11. In FIG. 6, assume that the first codeword 16 read out from the storage medium 8 includes a large number of errors, and is not corrected. Then, the storage device 2 receives the second redundant part 18 of the second codeword 19 from the server 3 via a wireless transmission channel using the wireless communication device 9. The storage device 2 applies error correction to the second codeword 19 including the first codeword 10 read out from the storage medium 8 and the second redundant part 18 received from the server 3 using the second decoder 13. Then, the storage device 2 provides the first information part 14 of the corrected first codeword 16, which corresponds to the second information part 17 of the corrected second codeword 19, to the host device 4.

Figure 7:
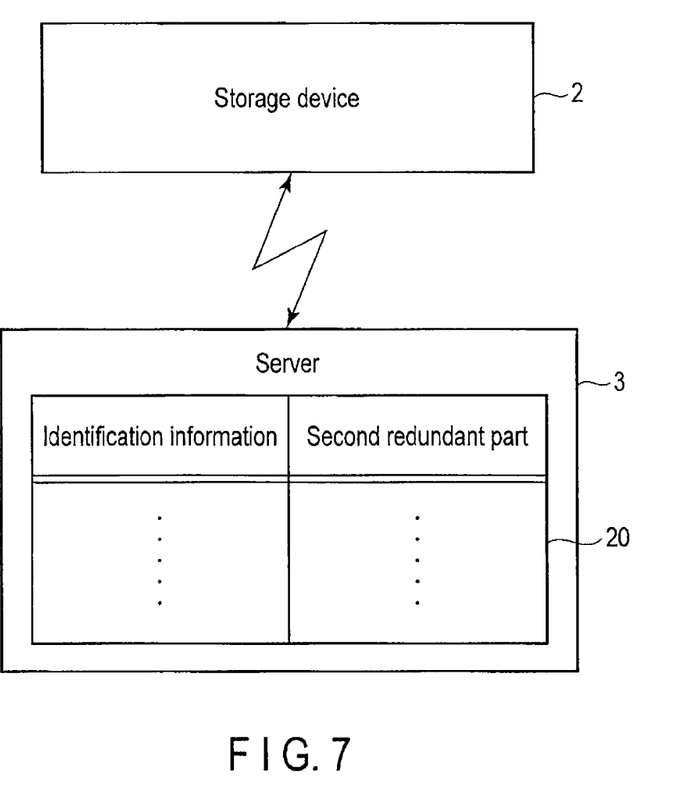
FIG. 7 is a block diagram showing an example of a storage format of a server according to the first embodiment.

FIG. 7 is a block diagram showing an example of the storage format of the server 3 according to this embodiment.

The server 3 manages, using a table 20, identification information such as an address and the second redundant part 18, which are received from the storage device 2, in association with each other.

Upon reception of identification information from the storage device 2, the server 3 reads out the second redundant part 18 corresponding to the received identification information from the table 20, and transmits the readout second redundant part 18 to the storage device 2.

Figure 8:
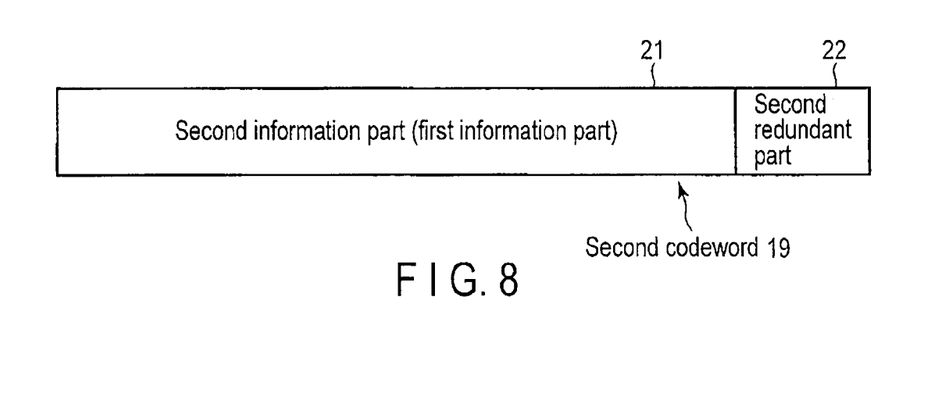
FIG. 8 is a block diagram showing a modified example of the second codeword.

Note that in the above description, the second codeword 19 is a combination of the second information part 17 corresponding to the first codeword 16, and the second redundant part 18 for this second information part 17. However, for example, as shown in FIG. 8, the second codeword 19 may be a combination of a second information part 21 including the first information part 14 of the first codeword 16, and a second redundant part 22 for that second information part 21. In this case, the second decoding processing corrects the first information part 14 using the second redundant part 22 of the second codeword 19.

According to the aforementioned embodiment, the error correction capability can be improved while suppressing a decrease in storage capacity of the storage medium.

In this embodiment, when data from the host device 4 is written in the storage device 2 having the storage medium 8, a plurality of codewords having different error correction capabilities are generated, and the first codeword 16 with the high encoding ratio is written in the storage medium 8. The encoding ratio of the second codeword 19 is equal to or lower than that of the first codeword 16 written in the storage medium 8, and the second codeword 19 has an error correction capability equal to or higher than the first codeword 16. The second redundant part 18 of the second codeword 19 is transmitted to and stores in the server 3, which is arranged independently of the storage device 2, via a wireless communication channel, but the second information part 17 of the second codeword 19 is not transmitted.

When the host device 4 reads out data from the storage device 2, the first codeword 16 is read out from the storage medium 8, and the first decoding processing is executed if necessary. When errors fail to be corrected by this first decoding processing, the second redundant part 18 of the second codeword 19 stored in the server 3 is read out using the wireless communication device 9, the first codeword 16, whose errors fail to be corrected is set as the second information part 17 of the second codeword 19, and the second decoding processing is executed using the second redundant part 18 of the second codeword 19 read out from the server 3. Then, the corrected data is transmitted to the host device 4.

In this manner, the data holding reliability of the storage system 1 as a whole can be enhanced while maintaining a high encoding ratio of data in the storage device 2. Data flowing through a wireless communication channel, that is, data stored in the server 3 includes the second redundant part 18 of the second codeword 19 and its identification information, and the second information part 17 is not stored in the server 3. Therefore, even when this data is stolen by a third party by eavesdropping or illicit access, it is very difficult to decode the first codeword 16 from the second redundant part 18 of the second codeword 19, thus establishing a secure system.

In this embodiment, the reliability of the storage device 2 which forms the storage system 1 can be improved.

In this embodiment, using the second codeword 19, bit errors, which are too much to be corrected, in the first codeword 16 can be corrected, and a failure ratio of the storage device 2 when viewed from the host device 4 can be reduced.

In this embodiment, the encoding ratio of the first codeword 16 is higher than that of the second codeword 19, and the encoding ratio of the second codeword 19 is higher than 0.5. Then, compared to a case in which all write data from the host device 4 are backed up by the server 3, a data amount which is transferred from the wireless communication device 9 of the storage device 2 to the server 3 via a wireless communication channel can be reduced, thus reducing the communication cost and the loads on the server 3.

Second Embodiment

This embodiment will explain an operation of a controller in an environment in which no wireless communication is available at the time of a data write or read access.

Figure 9:
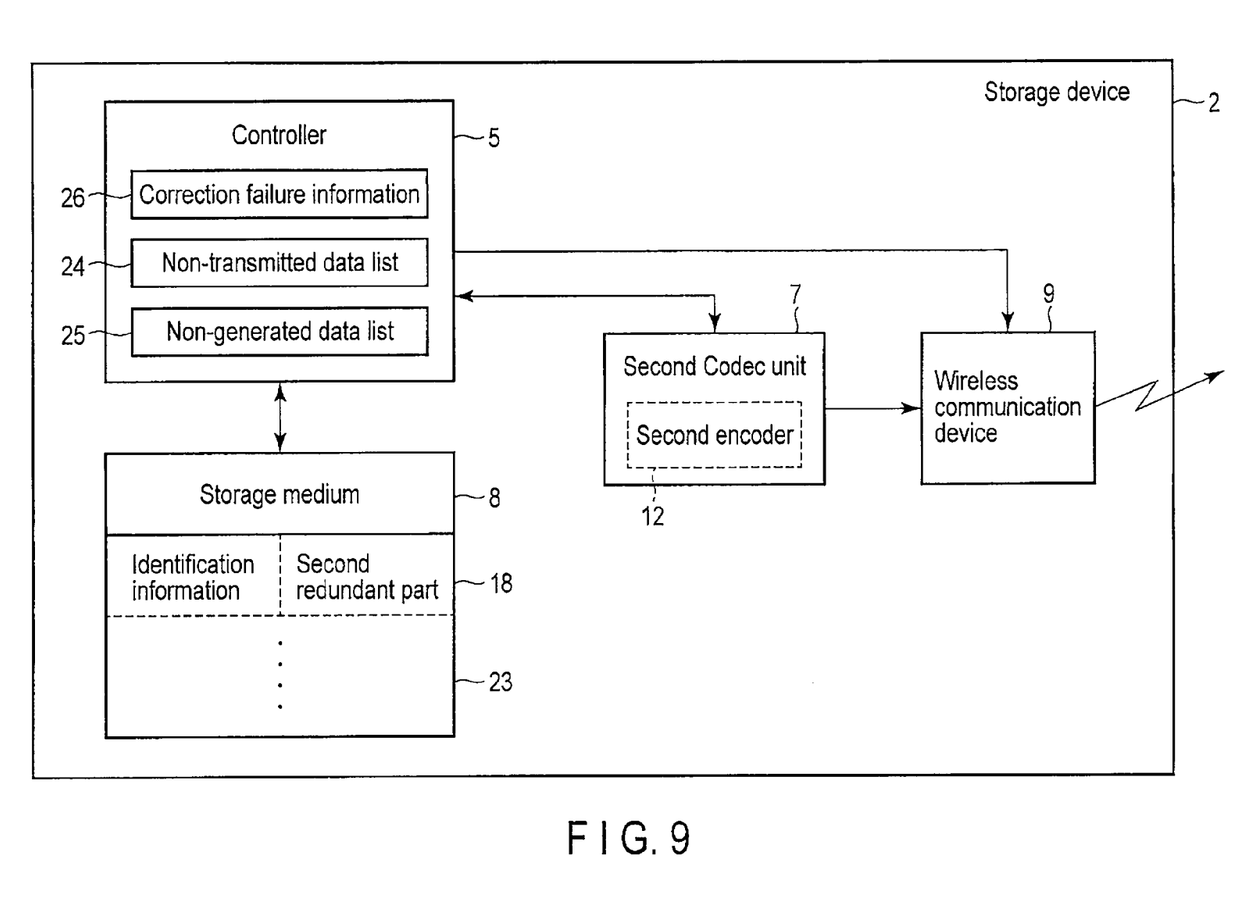
FIG. 9 is a block diagram showing an example of an operation of a second codec unit of a storage device according to a second embodiment.

FIG. 9 is a block diagram showing an example of an operation of the second Codec unit 7 of the storage device 2 according to this embodiment. FIG. 9 shows components related to the operation when no wireless communication is available at the time of a data write access, and other components are not shown.

In the storage device 2 according to this embodiment, the storage medium 8 includes an auxiliary area 23 which is not visible from the host device 4 and has a predetermined capacity. Note that the auxiliary area 23 may be provided independently of the storage medium 8.

The controller 5 includes a non-transmitted data list 24 and non-generated data list 25.

When the wireless communication device 9 and server 3 cannot wirelessly communicate with each other for a reason that, for example, there is no available access point around the storage device 2 at a data write access timing from the host device 4, the controller 5 generates a second redundant part 18 using the second encoder 12, stores identification information and the second redundant part 18 in the auxiliary area 23 of the storage medium 8 in association with each other, and additionally records the identification information in the non-transmitted data list 24.

When the free capacity of the auxiliary area 23 of the storage medium 8 is decreased to be smaller than a lower limit value, the controller 5 does not generate any second redundant part 18, and additionally records identification information of data, whose second redundant part 18 is not generated, in the non-generated data list 25.

When a wireless communication is recovered between the wireless communication device 9 and server 3, the controller 5 refers to the non-transmitted data list 24, and executes control to transmit the non-transmitted identification information and second redundant part 18, which are stored in the auxiliary area 23, to the server 3 using the wireless communication device 9.

When a wireless communication is recovered between the wireless communication device 9 and server 3, the controller 5 refers to the non-generated data list 25, reads out the first codeword 16, the second redundant part 18 of which is not generated, from the storage medium 8 based on the non-generated identification information, and generates the second redundant part 18 of the second codeword 19 using the readout first codeword 16 and the second encoder 12. The controller 5 executes control to transmit the identification information and the generated second redundant part 18 to the server 3 using the wireless communication device 9.

For example, when the first codeword 16 whose second redundant part 18 is not generated is read out from the storage medium 8, and decoding processing of this first codeword 16 has failed, the second encoder 12 does not generate the second redundant part 18. When the controller 5 of the storage device 2 receives a read request corresponding to the first codeword 16 whose decoding processing has failed from the host device 4, it returns a read error notification to the host device 4.

When the non-transmitted data list 24 and non-generated data list 25 are stored in a volatile storage medium, and the power supply of the storage device 2 is turned off, the controller 5 writes the non-transmitted data list 24 and non-generated data list 25 in a nonvolatile storage medium such as the storage medium 8 as management information. When the power supply of the storage device 2 is turned on again, the controller 5 can refer to the non-transmitted data list 24 and non-generated data list 25 stored in the nonvolatile storage medium.

When no wireless communication is available between the wireless communication device 9 and server 3 at the time of a data read access, and when the storage device 2 has succeeded decoding processing of the first codeword 16, no problem is posed.

When the decoding processing of the first codeword 16 has failed, and no wireless communication is available, the controller 5 returns a read error notification to the host device 4. At this time, the controller 5 records correction failure information 26 indicating a correction failure. When a wireless communication is available later, the controller 5 reads out the second redundant part 18 from the server 3, executes the second decoding processing, and writes the corrected first codeword 16 in the storage medium 8.

In the aforementioned embodiment, even when no wireless communication is available between the wireless communication device 9 and server 3, the second redundant part 18 is held in the storage device 2 while the capacity of the auxiliary area 23 has a free space. Thus, a failure ratio of the storage system 1 can be got closer to that when a wireless communication is always available.

In this embodiment, when bit errors of the storage medium 8 are correctable by the first codeword 16, correction can be executed in the storage device 2, and a normal operation can be made without being influenced by availability of a wireless communication.

In this embodiment, when only a decoding error of the first codeword 16 has occurred, the host device 4 need not receive any failure notification of the storage device 2, thus reducing a failure ratio of the storage system 1.

In this embodiment, when a wireless communication between the wireless communication device 9 and server 3 is recovered, the host device 4 may retry a data read access. In this embodiment, the wireless communication device 9 retransmits, to the server 3, the second redundant part 18 which is not transmitted from the storage device 2 to the server 3. Thus, the influence of a wireless communication environment state on a failure ratio of the storage system 1 can be reduced.

Note that a device controller or storage system may include the same functions as those of the storage device 2 according to this embodiment.

Some of operations and functions of respective components in the storage device 2 according to this embodiment may be implemented by other components. That is, the aforementioned operations need only be implemented by the storage device 2 as a whole, and assignment of operations and functions of components can be changed as needed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A storage device comprising:
a first encoder that generates a first codeword including a first information part corresponding to at least a part of write data, and a first redundant part used to correct the first information part;
a memory that stores the first codeword;
a second encoder that generates a second redundant part used to correct a second information part corresponding to the first codeword or the first information part; and
a wireless communication unit that wirelessly transmits the second redundant part to an external storage device without transmitting the second information part to the external storage device.

2. The device according to claim 1, further comprising:
a first decoder that corrects, when the first information part of the first codeword read out from the memory includes an error, and the error of the first information part is correctable using the first redundant part at a read access timing, the error of the first information part using the first redundant part; and
a second decoder that receives, when the error of the first information part is uncorrectable by the first decoder, the second redundant part from the external storage device via the wireless communication unit, and corrects the first codeword or the first information part using the second redundant part.

3. The device according to claim 2, further comprising a controller that issues a read error notification when the first decoder fails to correct an error of the first information part, and a communication disabled state is set between the wireless communication unit and the external storage device at a read access timing,
wherein when the communication disabled state is changed to a communication enabled state after the read error notification, the second decoder receives the second redundant part from the external storage device via the wireless communication unit, corrects the first codeword or the first information part using the second redundant part, and stores the corrected first codeword in the memory.

4. The device according to claim 1, wherein an encoding ratio of the first codeword is not less than an encoding ratio of a second codeword including the second information part and the second redundant part, and
the encoding ratio of the second codeword is higher than 0.5.

5. The device according to claim 1, further comprising a non-transmission storage unit that saves the second redundant part in a communication disabled state from the wireless communication unit to the external storage device,
wherein when the communication disabled state is changed to a communication enabled state, the wireless communication unit wirelessly transmits the second redundant part saved in the non-transmission storage unit to the external storage device.

6. The device according to claim 5, further comprising a non-generation storage unit that saves, when a free capacity of the non-transmission storage unit is smaller than a lower limit value, which is set in advance, identification information of the first codeword in place of the second redundant part,
wherein when the communication disabled state is changed to the communication enabled state, the second encoder generates the second redundant part based on the first codeword which is stored in the memory and corresponds to the identification information in the non-generation storage unit, and when the communication disabled state is changed to the communication enabled state, the wireless communication unit wirelessly transmits the second redundant part generated by the second encoder to the external storage device.

7. The device according to claim 6, wherein when the communication disabled state is changed to the communication enabled state, and when the first codeword, which is stored in the memory and corresponds to the identification information in the non-generation storage unit, is read out, but the first encoder fails to correct the first codeword, the second encoder does not generate the second redundant part, and the storage device further comprises a controller that issues a read error notification when the first codeword, the second redundant part of which is not generated and which is failed to be corrected by the first encoder, is read out.

8. The device according to claim 6, wherein at least one of the non-transmission storage unit and the non-generation storage unit is a volatile storage unit, and the storage device further comprises a controller that writes data stored in the volatile storage unit in a nonvolatile storage unit for saving before a power supply is turned off, and accesses data written in the nonvolatile storage unit to control the first encoder, the second encoder, and the wireless communication unit when the power supply is turned on again.

9. The device according to claim 1, wherein a wireless communication unit wirelessly transmits identification information of the second codeword to the external storage device.

10. An error correction method comprising:
generating a first codeword including a first information part corresponding to at least a part of write data, and a first redundant part used to correct the first information part at a write access timing;
storing the first codeword in a memory;
generating a second redundant part used to correct a second information part corresponding to the first codeword or the first information part;
wirelessly transmitting the second redundant part to an external storage device without transmitting the second information part to the external storage device;
correcting, when the first information part of the first codeword read out from the memory includes an error, and the error of the first information part is correctable using the first redundant part at a read access timing, the error of the first information part using the first redundant part; and
wirelessly receiving, when the error of the first information part is uncorrectable using the first redundant part, the second redundant part from the external storage device, and correcting the first codeword or the first information part using the second redundant part.

11. The method according to claim 10, wherein an encoding ratio of the first codeword is not less than an encoding ratio of a second codeword including the second information part and the second redundant part, and
the encoding ratio of the second codeword is higher than 0.5.

12. The method according to claim 10, further comprising saving the second redundant part to a non-transmission storage unit in a communication disabled state to the external storage device, and
wirelessly transmitting the second redundant part saved in the non-transmission storage unit to the external storage device when the communication disabled state is changed to a communication enabled state.

13. The method according to claim 12, further comprising saving identification information of the first codeword in place of the second redundant part in a non-generation storage unit when a free capacity of the non-transmission storage unit is smaller than a lower limit value, which is set in advance, and
generating the second redundant part based on the first codeword which is stored in the memory and corresponds to the identification information in the non-generation storage unit when the communication disabled state is changed to the communication enabled state, and
wirelessly transmitting the generated second redundant part to the external storage device when the communication disabled state is changed to the communication enabled state.

14. The method according to claim 13, wherein at least one of the non-transmission storage unit and the non-generation storage unit is a volatile storage unit, and
the method further comprises writing data stored in the volatile storage unit in a nonvolatile storage unit for saving before a power supply is turned off, and accessing data written in the nonvolatile storage unit when the power supply is turned on again.

15. The method according to claim 11, wherein identification information of the second codeword is wirelessly transmitted to the external storage device.

16. The method according to claim 13, wherein the method does not generate the second redundant part when the communication disabled state is changed to the communication enabled state, and when the first codeword, which is stored in the memory and corresponds to the identification information in the non-generation storage unit, is read out, but the first codeword is uncorrectable, and
issues a read error notification when the first codeword, the second redundant part of which is not generated and which is failed to be corrected, is read out.

17. The method according to claim 10, further comprising issuing a read error notification when an error of the first information part is uncorrectable and a communication disabled state is set at a read access timing, and
wirelessly receiving the second redundant part from the external storage device, correcting the first codeword or the first information part using the second redundant part, and storing the corrected first codeword in the memory when the communication disabled state is changed to a communication enabled state after the read error notification.

18. A storage system comprising a server device and a storage device, wherein
the storage device comprises
a first encoder that generates a first codeword including a first information part corresponding to at least a part of write data, and a first redundant part used to correct the first information part;
a memory that stores the first codeword;
a second encoder that generates a second redundant part used to correct a second information part corresponding to the first codeword or the first information part; and
a wireless communication unit that wirelessly transmits the second redundant part to the server device without transmitting the second information part to the external storage device.

19. The system according to claim 18, wherein the wireless communication unit wirelessly transmits identification information of the second codeword to the server device.

* * * * *